United States Patent [19]

Bährle et al.

[11] Patent Number: 4,521,280
[45] Date of Patent: Jun. 4, 1985

[54] METHOD OF MAKING PRINTED CIRCUITS WITH ONE CONDUCTOR PLANE

[75] Inventors: Dieter K. Bährle, Schönaich; Friedrich W. Schwerdt, Herrenberg, both of Fed. Rep. of Germany

[73] Assignee: International Business Machines Corporation, Armonk, N.Y.

[21] Appl. No.: 616,342

[22] Filed: Jun. 1, 1984

[30] Foreign Application Priority Data

Jun. 1, 1983 [EP] European Pat. Off. ........ 83105433.3

[51] Int. Cl.³ .......................... C25D 5/02; C25D 7/00
[52] U.S. Cl. ...................................... 204/15; 204/38.4
[58] Field of Search ................. 204/15, 192 R, 192 C, 204/38 B

[56] References Cited

U.S. PATENT DOCUMENTS

| | | | |
|---|---|---|---|
| 3,554,877 | 1/1971 | Geisler | 204/15 |
| 4,135,988 | 1/1979 | Dugan et al. | 204/15 |
| 4,217,182 | 8/1980 | Cross | 204/15 |
| 4,278,511 | 7/1981 | Dugan | 204/15 |
| 4,304,640 | 12/1981 | Walker | 204/15 |

Primary Examiner—Thomas Tufariello
Attorney, Agent, or Firm—Mark Levy

[57] ABSTRACT

A method of making printed circuits, where on both sides sacrificial foils are laminated onto a synthetic resin prepreg. Through-holes are drilled. The copper foil is subsequently etched off. A negative photoresist foil is laminated on the prepreg surface roughened by etched-off copper dendrites. The foil is exposed and developed in accordance with the respective conductive pattern. Subsequently, copper is sputtered onto the surface of the photoresist, the surface and the bottom of the photoresist channels defining the conductors, and onto the surface of the drilled holes by means of magnetron-enhanced cathode sputtering. The copper sputtered onto the surface of the photoresist is removed by means of a scrubbing roller. Then, copper is deposited in accordance with the additive process on the copper sputtered in the photoresist channels and the drilled holes. After the stripping of the photoresist, the printed circuit is completed.

12 Claims, 10 Drawing Figures

METHOD OF MAKING PRINTED CIRCUITS WITH ONE CONDUCTOR PLANE

BACKGROUND OF THE INVENTION

The invention relates to a method of making printed circuits and more particularly to a method of making printed circuits for use with multilayer circuit boards without mechanically pre-treating an epoxy resin surface.

When multilayer conductors are made in accordance with present prior art, the conductors are distributed over several planes, and these signal planes are laminated together with interposed prepregs and with the necessary number of power planes to form a multilayer circuit. Subsequently, the multilayer circuit is bored at predetermined places. By copper coating the through-holes a connection to the internal wiring is made. Owing to the high wiring density, particularly high demands are made today to the production of multilayer circuits with respect to the materials and methods used.

For making multilayer conductors two methods are applied. Generally, power planes are made following the subtractive method. This method uses as a starting material a copper-coated semifinished material (e.g., a glass-fiber reinforced epoxy resin foil) onto which 35 $\mu$m thick copper foil is laminated on one or both sides. During processing, several copper-coated carrier plates cut to a predetermined format are pressed together to form a package, and contact holes are drilled with numerically controlled automatic units. The deburred drilled holes are throughplated and a base layer of copper is chemically deposited on the bore walls which are galvanically reinforced. The surface of the copper-coated carrier plates is subsequently prepared for the actual conductor printing by a suitable pre-treatment. The surface is coated with a photoresist and exposed in accordance with the configuration of the conductors. In a developer process, the negative photoresist can be removed in the non-exposed areas. The conductor plate then passes through an etching system which removes the copper layer where it is no longer protected by the photoresist. Subsequent to the removal of the remaining resist, only the printed circuit is left on the epoxy resin insulating layer.

A disadvantage of the subtractive method is that a relatively thick copper coating has to be applied which is mostly removed again by etching. For that reason, this method is not economical for precision networks. It is therefore desirable to use a much thinner copper coating. Furthermore, the strong underetchings connected with the use of the subtractive method cause a limitation of the conductor width, so that conductor widths of less than 100 $\mu$m can no longer be made following this method.

For that reason, the signal planes which are used in multilayer circuits are made in accordance with another method: the additive method. The time-consuming and highly complicated additive method which is explained in detail hereinbelow, is implemented as follows. Onto a signal plane of four prepreg layers, a two-layer copper foil (5 $\mu$m thick) is laminated on both sides. The approximately 70 $\mu$m thick carrier foil is subsequently removed. The surface of the laminated parts is then scrubbed by means of an abrasive powder, cleaned, and dried. Then a negative photoresist is applied to increase the rigidity and a blanket exposure is carried out. After punching alignment holes, the signal plane holes are drilled, deburred and cleaned. Subsequently, the boring walls are activated with palladium chloride-tin-II-chloride and the previously applied negative photoresist is stripped off. The surface of the signal plane is processed with benzotriazole adhesion promoter and coated with a negative photoresist which is exposed image-wise and developed. In that state, the parts are immersed in a long term copper bath for approximately 20 hours. During this period, copper precipitates in the developed-out conductor channels on the approximately 5 $\mu$m thick copper foil and on the boring walls up to a desired thickness of approximately 40 $\mu$m. Subsequent to the building-up of the copper, a tin layer is applied on the copper lines. In the subsequent etching process, the thin copper foil is removed in those areas where there are no longer any tin-protected conductors. Then the tin layer is removed again. Finally the manufacturing process is terminated by the electrical testing of the parts after an inspection.

A decisive factor for a successful application of this method is the pre-treatment of the substrate surfaces prior to the lamination of the negative photoresist foil. An unsatisfactory resist adhesion causes the lift-off of the photoresist foil in the aggressive copper additive bath so that copper is deposited also in undesired areas, causing short-circuits in the signal lines. Repairing errors of this kind is very complicated or altogether impossible.

It is the object of the invention to provide a novel method of making multilayer circuits, which permits excellent adhesion of the photoresist foil on the substrate surface, and which eliminates a number of process steps of the above described additive method.

Essential advantages of the present invention as compared with previously known processes are that the photoresist foil can be laminated directly onto the epoxy resin surface; that all mechanical surface pre-treatments as well as all wet processes and the activation of the boring holes, the application of complicated adhesion promoters, the etching-off of the copper base foil and the application and removal of the protective tin cover of the copper conductors are no longer necessary. The copper layer applied by magnetron sputtering forms a tub-like structure onto which the copper is subsequently grown additively on three sides simultaneously, which increases the copper coating speed with conductor widths of less than 80 $\mu$m. On the whole, the method as disclosed by the invention is a brief and uncomplicated process.

SUMMARY OF THE INVENTION

The invention is based on laminating an adhesion-problematic photoresist foil directly onto the surface of an epoxy resin laminate from which a sacrificial copper foil has previously been etched off. This ensures an excellent adhesion between photoresist foil and epoxy resin surface because during the lamination process itself the photoresist foil is pressed into the pores of the roughened surface of the epoxy resin substrate which have been caused by etched-off copper dendrites, and therefore toothes without any seams with the epoxy resin substrate. After the image-wise exposure and developing of the photoresist foil, the entire surface is sputtered with copper. The copper is selectively removed from the outer surface of the photoresist foil which is very smooth, either by being pulled off with an adhesive tape or by wet scrubbing in a continuous process. The sputtered-on copper remains in the photoresist channels (i.e., in the location of future conductors) and on the boring walls. There, after immersion in a long-term copper bath, copper grows to the desired layer thickness. The completion of the signal plane merely requires the stripping of the photoresist. There are no subsequent processes.

BRIEF DESCRIPTION OF THE DRAWING

In the drawing.

FIGS. 2A and 2B, right-hand side, represent the process steps in accordance with the present invention.

DESCRIPTION OF THE PREFERRED EMBODIMENT

Figure 1A:
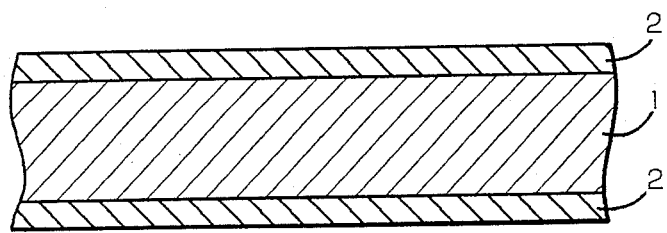
FIGS. 1A to 1H depict schematic cross-sections of a structure made in accordance with the preferred embodiment of the present invention.
Figure 2A:
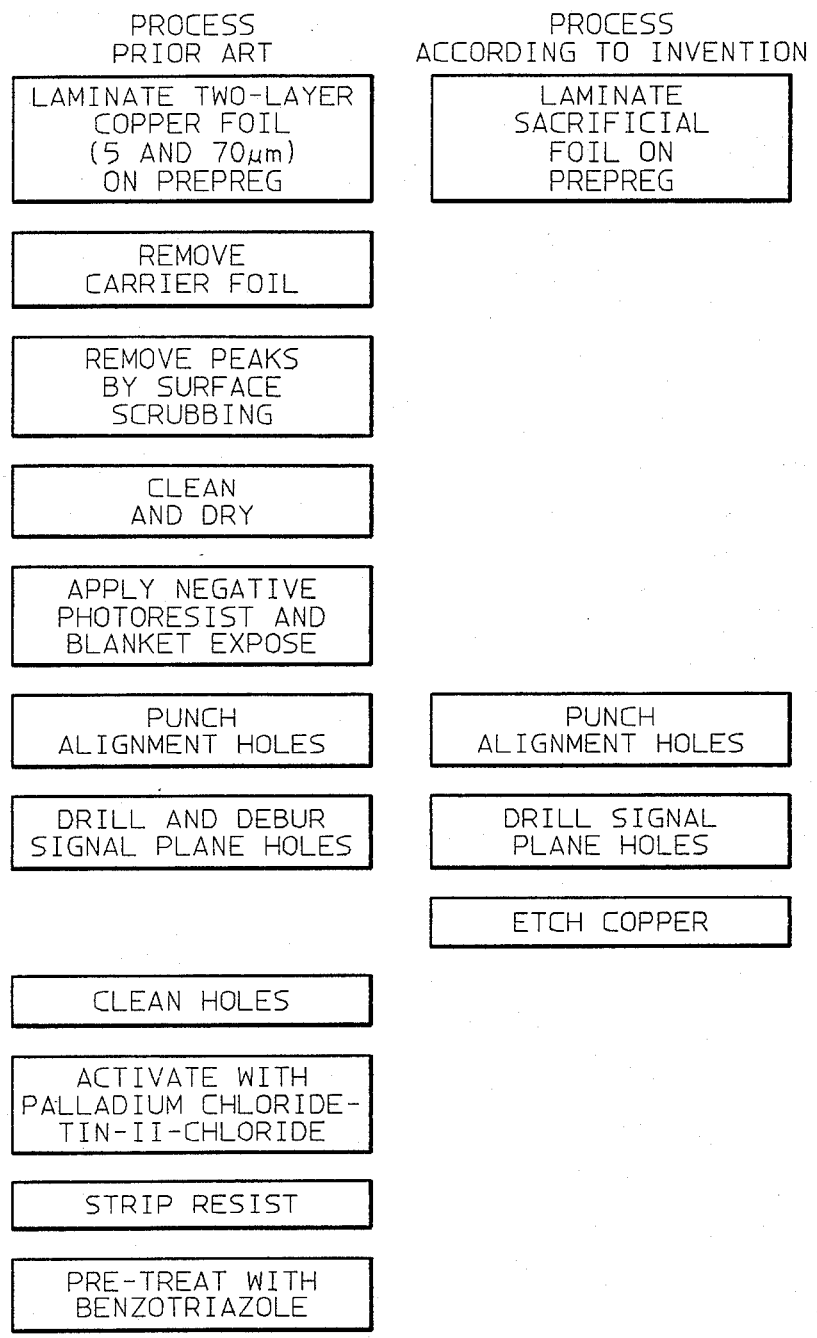
FIGS. 2A and 2B, left-hand side, represent the process steps of the prior art.
Figure 2B:
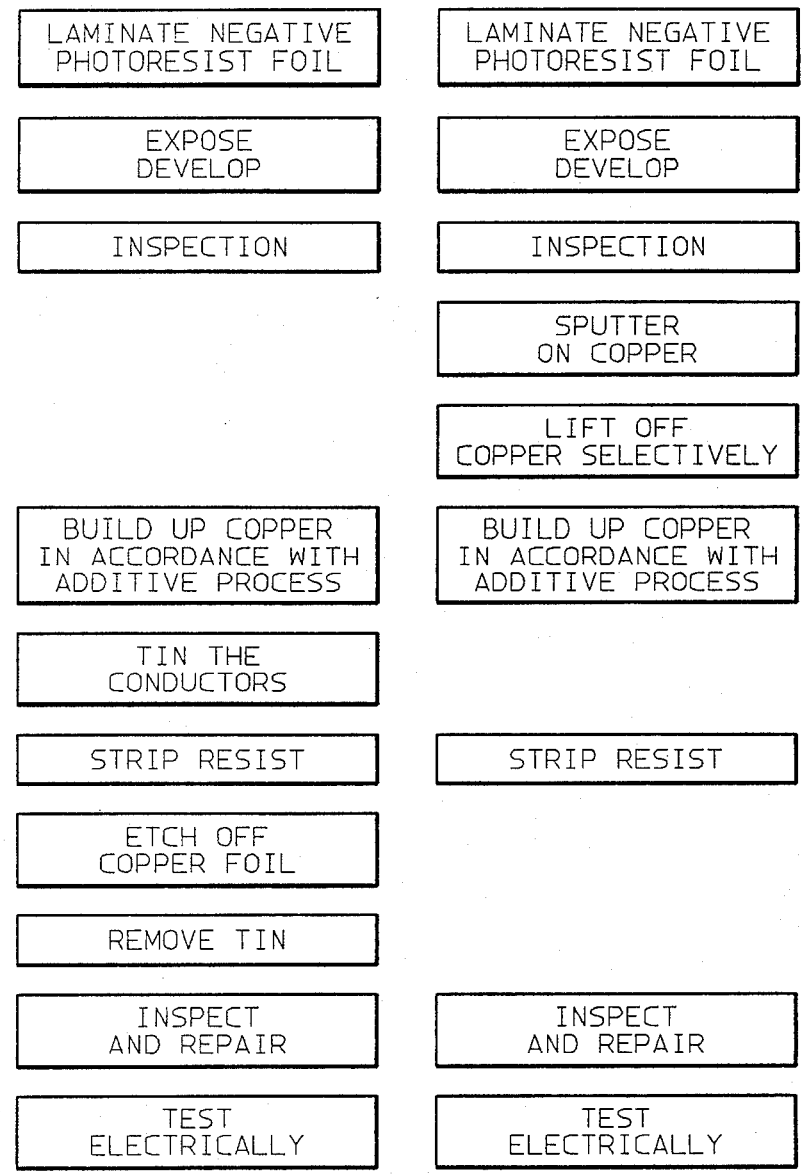

Referring now to FIG. 1A and the flow diagram, FIGS. 2A and 2B, right-hand side, four green prepregs on epoxy resin basis 1 are laminated together with so-called sacrificial copper foils 2 at 190° C. The 1 oz. sacrificial foils used are copper foils with a thickness of 0.035 mm. The effect of the lamination of the sacrificial foils is that the signal plane laminate is stabilized, and the dendritic structure of the lower side of the copper foil is duplicated during lamination in the surface of the epoxy resin laminate, causing a desired roughness there. The prepregs have to be dyed because colorless epoxy resin is too transparent to light in the subsequent two-side exposure, so that when the front is exposed the back would be exposed, too.

Figure 1B:
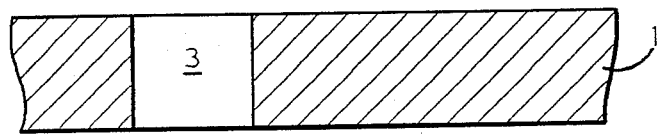
Figure 1C:
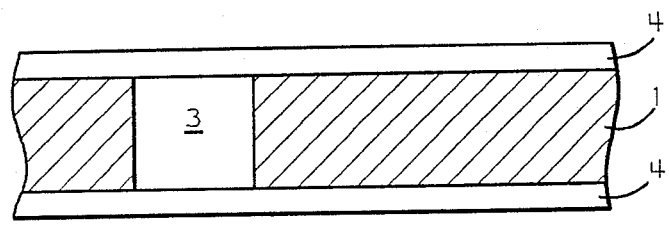

In the copper-coated laminate 1, two alignment holes (not shown) are punched. Subsequently, by means of numerically controlled automatic devices, holes 3 are drilled into the copper coated laminate to establish the connection between the X and Y wiring. The advantage of the method as disclosed by the invention is that unlike formerly known methods (FIG. 2A, left-hand side) no photoresist layer must be applied prior to drilling because part 1 is sufficiently rigid due to sacrificial foils 2. Separate cleaning of the drilled holes 3 is not necessary either, because after drilling copper layers 2 are etched off in a high pressure spraying system with $CuCl_2$. Following this step a drilled, cleaned laminate (FIG. 1B) with a very rough surface is available.

Subsequently, a negative photoresist foil 4 (e.g., Riston T 168 by du Pont which is a dyed polymer on the basis of methyl methacrylate, pentaerythritoltetraacrylate with t-butylanthraquinone as an activator) is laminated on both sides onto the roughened laminate 1. During the lamination process which is carried out at approximately 110° C.–120° C. and at an advance speed of 1 cm/sec., the photoresist foil softens so that it is bonded without seams to the epoxy resin substrate. The intimate contact between foil and substrate can be proven by microscopic views of polished samples. An advantage compared with conventional methods (left-hand side of FIG. 2A) is that photoresist foil 4 adheres to the epoxy resin substrate 1 without the latter having to be prepared (e.g., by scrubbing), or without an adhesion promoter such as benzotriazole being used.

Figure 1D:
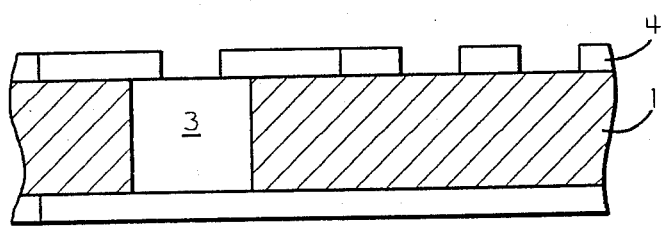

The laminate is subsequently exposed in a known manner by a mask on front and back. Since in the method according to the invention there is no copper under the photoresist, a correspondingly reduced amount of light is reflected, with the result of an exposure time longer by approximately 20% (increase by two gray wedge steps). Subsequently, development with 1,1,1-trichloroethane (FIG. 1D) is carried out in a known manner in a continuous process.

After a first inspection, the laminate is blanket copper-sputtered on both sides in a continuous process using four magnetron-enhanced copper cathodes. Both sides are sputtered simultaneously until a layer thickness of 200 nm is reached. The layer thickness for the sputtered-on copper ranges from 80 to 500 nm.

The various parameters for this process step are the following:

Starting pressure: $\leq 5 \times 10^{-5}$ mbar
Oxygen glow discharge for cleaning: 2 minutes
$O_2$-partial pressure: $2 \times 10^{-1}$ mbar
Argon partial pressure: $5 \times 10^{-3}$ mbar
Argon flow: 80 cm$^3$/min.
Flow speed: 1–3 cm/sec.
Substrate temperature: $\leq 80°$ C.
Sputter rate: $\sim 10$ nm/sec.
Copper layer thickness: 200 nm.

Figure 1E:
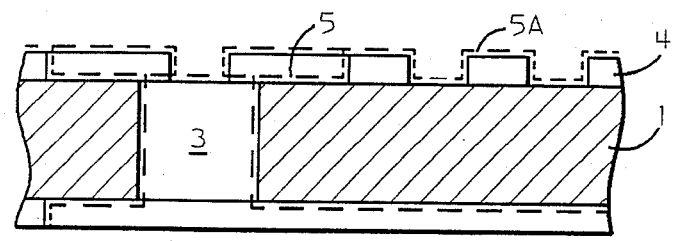

Copper 5, 5a (FIG. 1E) is deposited during sputtering on the photoresist surface, on the side walls of the developed conductor channels, on the bottom, (i.e., on the roughened epoxy resin surface), and in the drilled holes. This copper deposition replaces the formerly used complex and expensive palladium-tin-II-chloride activating processes (FIG. 2A, left-hand side). According to the invention, the sputtering makes an almost waterproof tub in the conductor channels, making it almost impossible for the bath fluid used in the subsequent additive process to penetrate beneath the photoresist.

Figure 1F:
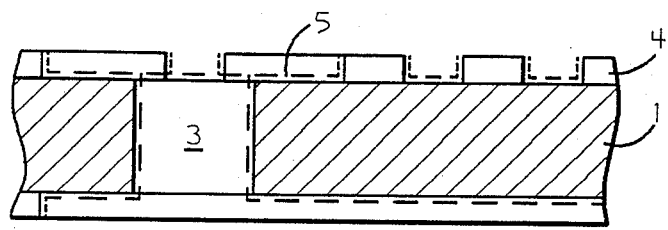

The lifting-off of copper 5a from the photoresist surface (FIGS. 1E, 1F) is also carried out in a continuous process where wet, rotating scrubbing rollers completely remove copper 5a which insufficiently adheres to the surface of resist 4. The sputtered-on copper remains only in the resist channels as activating layer 5. In this process step, a scrubbing rate of approximately 160 Watt has proved to be optimum. With scrubbing rates of more than 200 Watt, too much photoresist 4 is removed and the resist edges are deformed by faulty polishing.

Figure 1G:
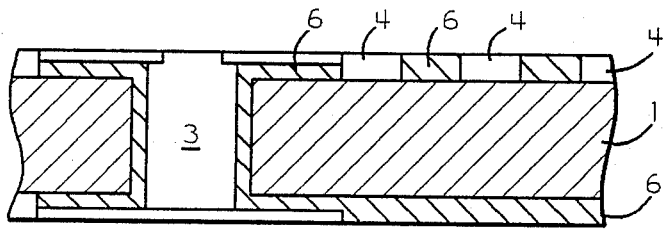

In the following copper build-up in accordance with the additive process, copper 6 (FIG. 1G) is deposited in the conductor channels from three sides simultaneously. Owing to the smooth photoresist walls, an extremely precise geometry of the conductor structures is obtained. The growth rate which depends on the conductor widths is up to 30% higher for conductor widths of less than 80 μm than in those processes where the copper grows from the bottom only. The operating data of the copper bath correspond to those of the formerly used additive method, and can be found, for example, in the multilayer circuit handbook by G. Herrmann, 2nd edition, Leuze-Verlag, page 263.

Figure 1H:
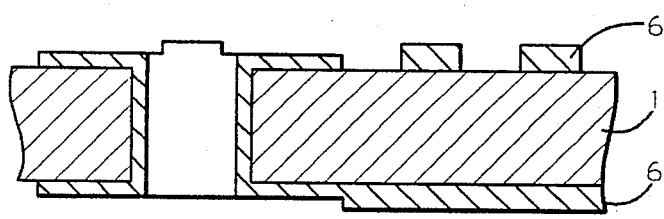

In a last step photoresist 4 is stripped in a known manner with dichloromethane, with a signal core in accordance with FIG. 1H being obtained. Since the method as disclosed by the invention did not comprise a blanket copper basis this does not have to be etched off, either. For that reason, there are no process steps for protective tinning, and for etching the tin off the copper conductors. The inspection to be carried out after the termination of the method as disclosed by the invention is only half as complex as that of the formerly used additive method (FIG. 2B).

The thin laminates at the beginning of the process are of a high dimensional stability because the copper foil is etched off and not removed mechanically, as in prior art methods. Mechanical surface pre-processing like scrubbing, the application of complicated adhesion promoters, and the cleaning and activation of drilled hole walls, are superfluous. Due to the fact that the photoresist foil is laminated directly onto a roughened epoxy resin surface, excellent adhesion of the photoresist is ensured. Copper plating is initiated by magnetron-enhanced sputtering of copper, the conductor channels being copper-coated on all sides. The sputtered-on copper layer is not penetrated by the additive bath. The copper grows uniformly from three sides so that the copper-growing speed for predetermined conductor widths is increased by approximately 30%. On the whole, the method as disclosed by the invention involves a considerably reduced amount of errors based on the constriction effect and photoresist adhesion problems, with the result of an increased yield. The method as disclosed by the invention is brief and uncomplicated, as all subsequent wet processes are superfluous.

We claim:

1. Method of making printed circuits with one conductor plane, characterized by the following process steps:
   (a) laminating a sacrificial foil onto a synthetic resin prepreg;
   (b) drilling through-holes;
   (c) etching off the sacrificial foil;
   (d) laminating a negative photoresist foil onto the surface of the prepreg;
   (e) exposure in accordance with the desired conductor pattern, and developing;
   (f) sputtering copper on the surface of the photoresist, on the walls and the bottom of the photoresist channels defining the conductors, and on the surface of the drilled holes;
   (g) lift-off of copper sputtered onto the surface of the photoresist;
   (h) depositing copper on copper sputtered on the photoresist channels and the drilled holes, following the additive method; and
   (i) stripping the photoresist.

2. Method as claimed in claim 1, characterized in that the steps (a) and (c) to (i) are carried out simultaneously on both sides of the base material.

3. Method as claimed in claim 1, characterized in that in accordance with step (a) sacrificial copper foils are laminated onto a prepreg of epoxy resin.

4. Method as claimed in claim 3, characterized in that sacrificial foils with a layer thickness of 0.035–0.045 mm are laminated onto the prepreg at temperatures in the range of 170° C.–190° C.

5. Method as claimed in claims 1 or 2 or 3 or 4, characterized in that dyed epoxy resin prepregs are used.

6. Method as claimed in claim 1, characterized in that in accordance with step (c) the sacrificial foil is etched off in a high pressure spraying system with hydrochloric copper-II-chloride solution.

7. Method as claimed in claim 1, characterized in that in accordance with step (d) a negative photoresist foil is bonded by lamination, at temperatures in the range of 110° C.–120° C., without any seams to the surface of the epoxy resin prepreg roughened by the etching-off of the sacrificial foil.

8. Method as claimed in claim 1, characterized in that prior to process step (f), an oxygen glow discharge is carried out to clean the substrate.

9. Method as claimed in claim 1, characterized in that by means of magnetron-enhanced high efficiency cathode sputtering, copper is applied to the surface and the bottom of the photoresist channels defining the conductors, and to the surface of the drilled holes in a layer of thickness of 80 to 500 nm.

10. Method as claimed in claim 9, characterized in that the photoresist channels are coated tub-like by the sputtered-on copper.

11. Method as claimed in claims 1 or 9, characterized in that the copper sputtered onto the photoresist surface is completely removed therefrom by means of wet, rotating scrubbing rollers.

12. Method as claimed in claim 1, characterized in that in accordance with step (h) copper grows from three sides simultaneously on copper sputtered on the channels.

* * * * *